(12) United States Patent
Chen et al.

(10) Patent No.: US 9,324,836 B2
(45) Date of Patent: Apr. 26, 2016

(54) METHODS AND APPARATUS FOR DOPED SIGE SOURCE/DRAIN STRESSOR DEPOSITION

(71) Applicant: Taiwan Semiconductor Manufacturing Company, Ltd., Hsin-Chu (TW)

(72) Inventors: Chao-Hsuing Chen, Tainan (TW); Ling-Sung Wang, Tainan (TW); Chi-Yen Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/825,331

(22) Filed: Aug. 13, 2015

(65) Prior Publication Data
US 2015/0349090 A1    Dec. 3, 2015

Related U.S. Application Data

(62) Division of application No. 13/371,177, filed on Feb. 10, 2012, now Pat. No. 9,142,642.

(51) Int. Cl.
*H01L 29/66* (2006.01)
*H01L 21/02* (2006.01)
*H01L 29/78* (2006.01)

(52) U.S. Cl.
CPC ...... *H01L 29/66636* (2013.01); *H01L 21/0257* (2013.01); *H01L 21/02532* (2013.01); *H01L 21/02579* (2013.01); *H01L 21/02639* (2013.01); *H01L 29/66628* (2013.01); *H01L 29/7848* (2013.01)

(58) Field of Classification Search
CPC .............. H01L 29/66636; H01L 29/7848; H01L 29/165
See application file for complete search history.

(56) References Cited

U.S. PATENT DOCUMENTS

| 7,544,997 | B2 * | 6/2009 | Zhang | H01L 29/0847 257/200 |
| 7,727,870 | B2 * | 6/2010 | Zhang | H01L 21/823807 257/E21.176 |
| 7,781,799 | B2 | 8/2010 | Yu et al. | |
| 8,017,487 | B2 * | 9/2011 | Chong | H01L 21/823807 257/E21.43 |
| 8,154,084 | B2 * | 4/2012 | Hoentschel | H01L 21/26506 257/369 |
| 8,450,775 | B2 * | 5/2013 | Chong | H01L 21/823807 257/190 |
| 8,455,860 | B2 * | 6/2013 | Ko | H01L 29/41775 257/192 |
| 2008/0001182 | A1 * | 1/2008 | Chen | H01L 21/823807 257/255 |
| 2008/0197412 | A1 * | 8/2008 | Zhang | H01L 29/0847 257/344 |
| 2008/0261362 | A1 * | 10/2008 | Zhang | H01L 21/823807 438/230 |
| 2009/0124056 | A1 * | 5/2009 | Chen | H01L 21/26513 438/278 |

(Continued)

FOREIGN PATENT DOCUMENTS

| CN | 101419979 A | 4/2009 |
| KR | 20080098894 A | 11/2008 |

(Continued)

*Primary Examiner* — Jaehwan Oh
(74) *Attorney, Agent, or Firm* — Slater & Matsil, L.L.P.

(57) ABSTRACT

A method of manufacturing a semiconductor device includes etching a recess into a substrate and epitaxially growing a source/drain region in the recess. The source/drain region includes a first undoped layer of stressor material lining the recess, a lightly doped layer of stressor material over the first undoped layer, a second undoped layer of stressor material over the lightly doped layer, and a highly doped layer of stressor material over the second undoped layer.

20 Claims, 7 Drawing Sheets

(56) References Cited

U.S. PATENT DOCUMENTS

| | | | |
|---|---|---|---|
| 2009/0152634 A1* | 6/2009 | Grant | H01L 21/28114 257/368 |
| 2010/0276668 A1* | 11/2010 | Ko | H01L 29/41775 257/24 |
| 2011/0068396 A1* | 3/2011 | Cheng | H01L 29/165 257/335 |
| 2011/0284968 A1* | 11/2011 | Lee | H01L 29/66545 257/368 |
| 2012/0001228 A1* | 1/2012 | Chong | H01L 21/823807 257/190 |
| 2012/0080720 A1* | 4/2012 | Grant | H01L 21/28114 257/190 |
| 2012/0112280 A1* | 5/2012 | Johnson | H01L 21/76237 257/347 |
| 2013/0069172 A1* | 3/2013 | Liao | H01L 29/41783 257/408 |

FOREIGN PATENT DOCUMENTS

| | | |
|---|---|---|
| KR | 20090023615 A | 3/2009 |
| KR | 20090118935 A | 11/2009 |
| KR | 100942965 B1 | 2/2010 |
| TW | 201039442 A | 11/2010 |

\* cited by examiner

METHODS AND APPARATUS FOR DOPED SIGE SOURCE/DRAIN STRESSOR DEPOSITION

PRIORITY CLAIM AND CROSS-REFERENCE

This application is a divisional of U.S. patent application Ser. No. 13/371,177, filed Feb. 10, 2012, entitled "Methods and Apparatus for Doped SiGe Source/Drain Stressor Deposition," which application is hereby incorporated herein by reference in its entirety.

BACKGROUND

Size reduction of metal-oxide-semiconductor field-effect transistors (MOSFETs) has enabled continued improvement in speed, performance, density, and cost per unit function of integrated circuits. One way to further improve MOSFET performance is through selective application of stress to the transistor channel region. Stress distorts (i.e., strains) the semiconductor crystal lattice, and the distortion, in turn, affects the band alignment and charge transport properties of the semiconductor. By controlling the magnitude and distribution of stress in a finished device, carrier mobility can be increased and this improves device performance.

One approach of introducing stress in the transistor channel region includes growing an epitaxial layer of SiGe within recesses in the source/drain regions. In this approach, lattice mismatch between the epitaxial SiGe and the silicon substrate is used to create a uni-axial compressive stress within the channel region. This occurs because the SiGe lattice constant is greater than the underlying substrate lattice constant. One problem facing complementary metal-oxide-semiconductor (CMOS) manufacturing is that N-channel metal-oxide-semiconductor (NMOS) and P-channel metal-oxide-semiconductor (PMOS) devices require different types of stress in order to achieve increased carrier mobility. PMOS fabrication methods may include applying a compressive stress to the channel. However, the same compressive stress that benefits carrier mobility in PMOS devices is also detrimental to NMOS devices, which require a different stress, (e.g., Tensile stress), to increase carrier mobility. Therefore, CMOS manufacturing techniques may address PMOS and NMOS devices separately.

High germanium concentration in epitaxial silicon germanium (e-SiGe) may be needed to effectively boost channel compressive strain in PMOS devices. Boron dopant atoms may be incorporated into the e-SiGe to provide the required semiconductor doping to form the P-type transistor, and to lower sheet resistance and thus improve contact resistance in the SiGe source drain regions. However, because of the high concentration of boron in the e-SiGe, the boron may tend to out-diffuse into the transistor channel region. Boron out-diffusion in a PMOS may result in a voltage threshold ($v_t$) reduction in short channel transistors. This roll-off in $v_t$ is referred to as a short channel effect (SCE). SCE is more predominant as transistor sizes are reduced in advanced semiconductor processes, and negatively impacts transistor performance. Control of the boron in the SiGe source/drain regions is therefore needed. As the source/drain regions are formed physically proximate to the channel region in order to provide the compressive stress needed boron atoms may diffuse into the channel region. The presence of unwanted boron in the channel region adversely impacts transistor performance.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

The embodiments herein are illustrative examples but do not limit the scope of the disclosure and do not limit the scope of the appended claims. Embodiments of this disclosure include methods and apparatus for novel SiGe epitaxial source/drain regions with improved performance, reduced junction leakage, and reduced short channel effects. In the embodiments, control of the boron or other dopant atoms used to dope the source/drain regions during epitaxy of the SiGe source drain material is maintained. A plurality of SiGe layers having different doping levels is formed, the embodiments include a first level in the source drain region that is undoped SiGe, a second level that is lightly doped SiGe, a highly doped SiGe level, and a cap layer that is very highly doped to reduce contact resistance and sheet resistance at the surface for enhanced contact performance. In other embodiments an additional layer of undoped SiGe is formed within the layers to further enhance performance. By controlling the dopant atom concentration throughout the SiGe epitaxial process, the short channel effects and junction leakage problems observed in conventional approaches may be reduced or eliminated, and the performance of the PMOS devices fabricated using the embodiments is markedly improved.

Although the embodiments are described with respect to illustrative examples in a specific context, namely boron doped, epitaxially grown, SiGe embedded stressors for source/drain regions in PMOS transistors, the methods may also be applied, however, to other semiconductor devices including other stressor materials, for example Si doped with Sb and the like.

Figure 1:
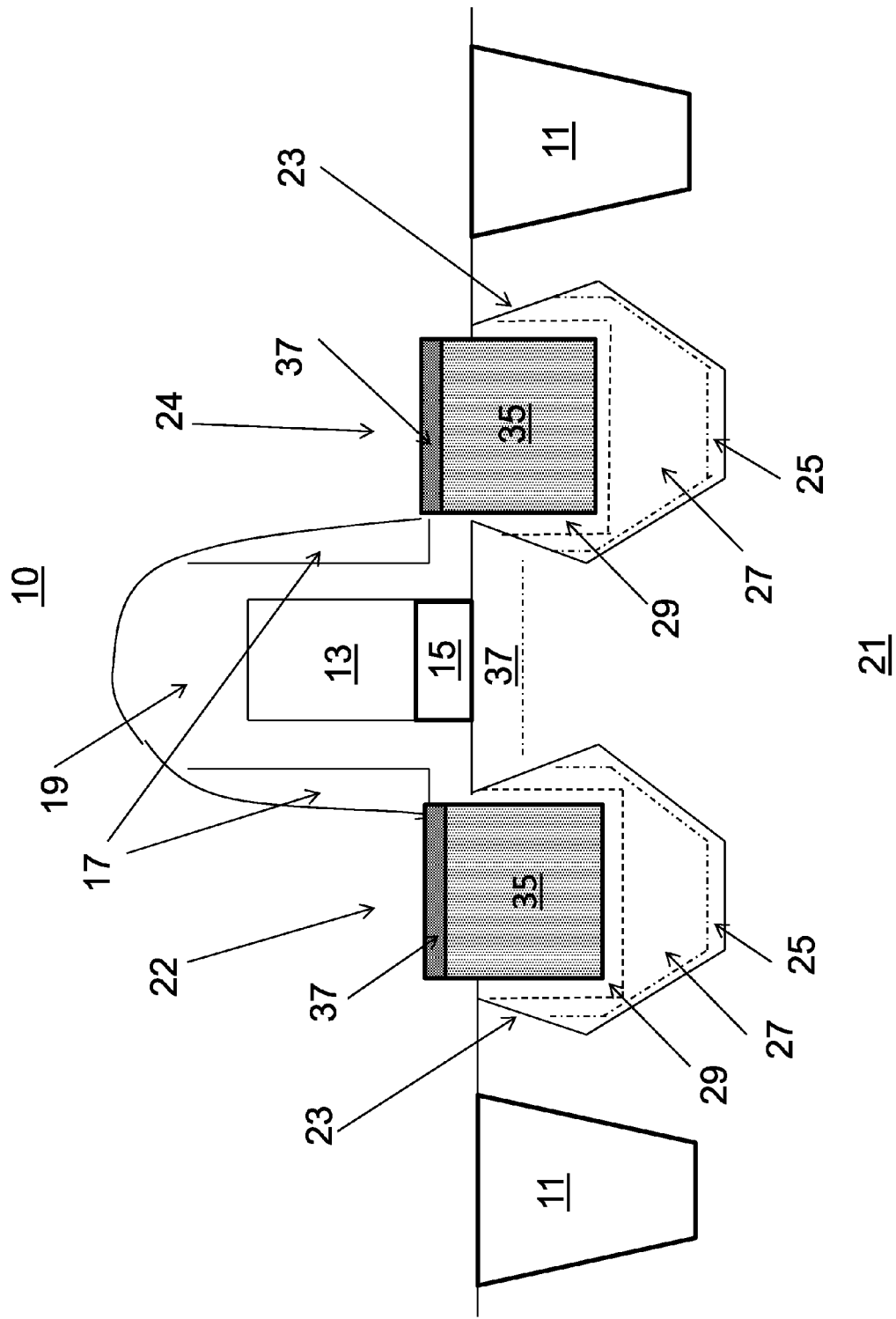
FIG. 1 depicts a cross-sectional view of selected features of an illustrative embodiment.

FIG. 1 depicts a cross-sectional view of selected features of an illustrative embodiment. Transistor 10, which may be for example a PMOS transistor in a CMOS device such as an integrated circuit incorporating many P and N MOS transistors, is shown with gate electrode 13 and gate dielectric 15 on a substrate 21. On opposing sides of the gate structure 13/15 are source 22 and drain 24. Source/drain regions 22/24 comprise recessed portions 23. The recessed portion 23 is embedded with boron doped stressor material in layers 25, 27, 29 35 and covered by cap layer 45. Boron doped stressor material forming the layers 25, 27, 29, and 35 in the recesses 23 may be epitaxial SiGe for example. A channel region 37 is shown. Use of the SiGe in the source drain recesses 23 formed in the silicon substrate 21 is known to create a uni-axial compressive stress in the channel region 37 due to lattice mismatch between the SiGe and the substrate material. This compressive stress increases carrier mobility (hole mobility) and thus improves transistor performance. Increased carrier mobility is especially important for PMOS FET devices, which tend to have somewhat less performance than NMOS devices produced in the same semiconductor process. When CMOS circuits such as inverters are formed, it is preferred that the NMOS and PMOS transistors have more or less symmetric performance characteristics. Enhancing PMOS transistor performance by increasing the carrier mobility thereby improves the CMOS performance in the device.

Figure 2:
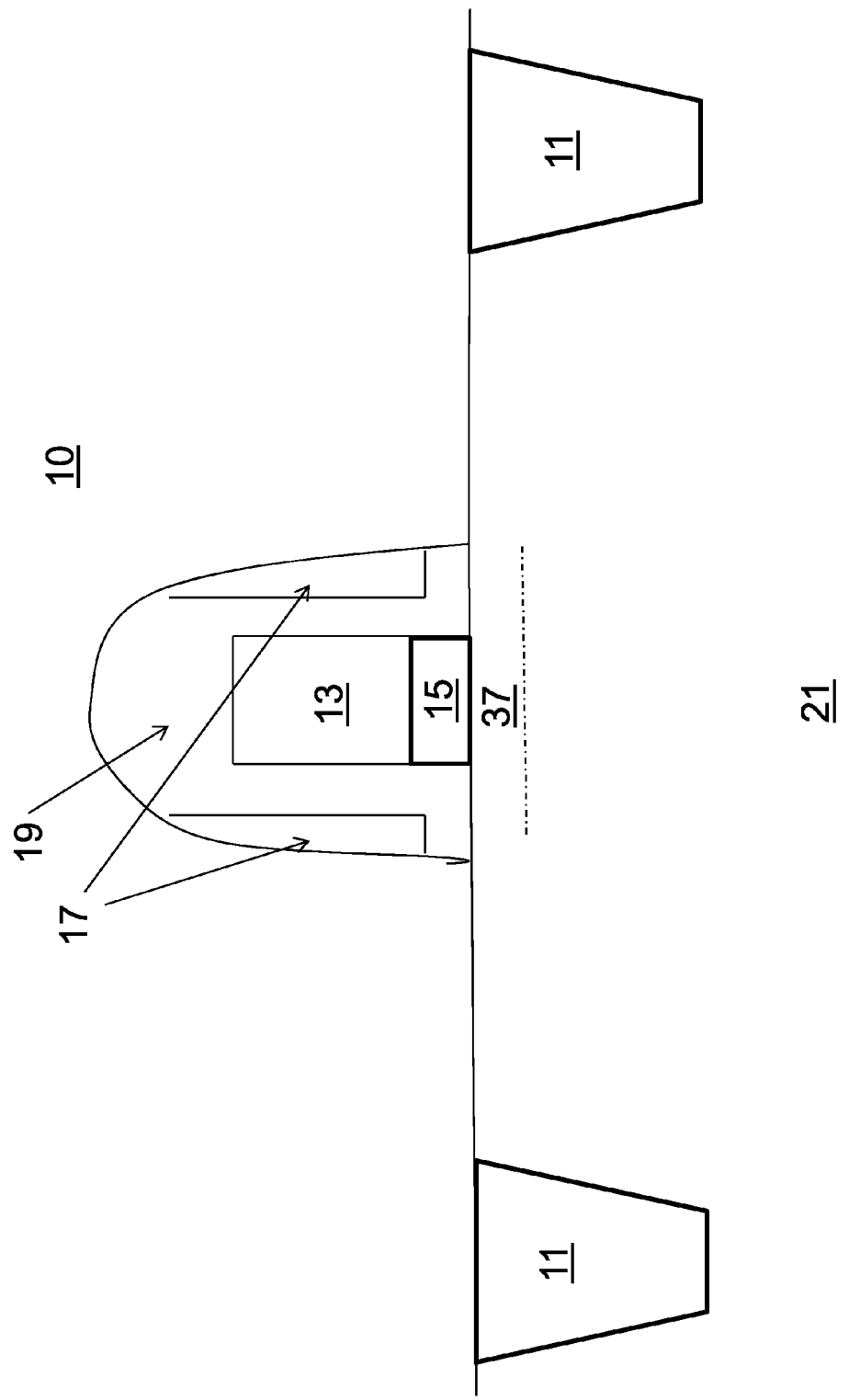
FIGS. 2-4 show cross-sectional views of selected process steps illustrating a first embodiment of an embodiment.

With reference now to FIGS. 2-5, shown are cross-sectional views of selected process steps illustrating a first embodiment of a method for forming an embodiment transistor. FIG. 2 illustrates transistor 10 (such as transistor 10 in FIG. 1) including substrate 21 and shallow trench isolation (STI) regions 11. Substrate 21 may comprise bulk silicon, doped or undoped, or an active layer of a silicon on insulator (SOI) substrate. Generally, an SOI substrate comprises a layer of silicon, formed on an insulator layer (not shown). The insulator layer may be, for example, a buried oxide layer or a silicon oxide layer. The insulator layer is provided on a substrate, typically silicon or glass substrate. Other substrates that may be used include multi-layered substrates, gradient substrates, or hybrid orientation substrates.

Shallow trench isolation (STI) structures 11 are shown on both sides of transistor 10. Substrate 21 further includes a gate electrode 13 and a gate dielectric 15. Underlying the gate electrode 13 and the gate dielectric 15 is carrier channel region 37. Carrier channel region 37 will provide a connecting path for carriers between the subsequently formed source and drain regions (not shown but described below).

The gate dielectric 15 may include, in a non-limiting example, silicon oxide having a thickness from about 6 to 100 Å, and more preferably less than about 20 Å. In other embodiments, the gate dielectric 15 may include a high-k dielectric having a k-value greater than about 3.8, the dielectric constant "k" for silicon dioxide, sometimes referred to as "oxide". Possible high-k dielectrics include $Ta_2O_5$, $TiO_2$, $Al_2O_3$, $ZrO_2$, $HfO_2$, $Y2O3$, $L_2O_3$, and their aluminates and silicates. Other suitable high-k gate dielectrics may include hafnium-based materials such as $HfO_2$, Hsiao, and $HfAlO_x$. In a preferred embodiment in which the gate dielectric 110 comprises an oxide layer, the gate dielectric 15 may be formed by an oxidation process, such as wet or dry thermal oxidation in an ambient, including an oxide, $H_2O$, NO, or a combination thereof, or by chemical vapor deposition (CVD) techniques using tetraethylortho-silicate (TEOS) and oxygen as a precursor.

The gate electrode 13 is formed of a conductive material such as Ta, Ti, Mo, W, Pt, Al, Hf, Ru, and silicides or nitrides thereof, doped poly-silicon, other conductive materials, or a combination thereof. Metal replacement gates may be used. In one example, amorphous silicon is deposited and recrystallized to create poly-crystalline silicon (poly-silicon). In the preferred embodiment in which the gate electrode is poly-silicon, gate electrode 13 may be formed by depositing doped or undoped poly-silicon by low-pressure chemical vapor deposition (LPCVD) to a thickness in the range of about 400 Å to about 2500 Å, but more preferably about 1500 Å.

Gate dielectric 15 and gate electrode 13 may be patterned by photolithography techniques known in the art. Generally, photolithography involves depositing a photoresist material, which is then masked, exposed, and developed. After the photoresist mask is patterned, an etching process may be performed to remove unwanted portions of the gate dielectric material and the gate electrode material in a patterning step to form gate dielectric 15 and gate electrode 13 as illustrated in FIGS. 1 and 2. In the example embodiment in which the gate electrode material is poly-crystalline silicon and the gate dielectric material is an oxide, the etching process may be a wet or dry, anisotropic or isotropic, etch process, but preferably is an anisotropic dry etch process.

Dummy sidewall spacers 17, 19 may be formed on opposite sides of the gate electrode 13 and gate dielectric 15. Dummy sidewall spacers 17 and 19 may comprise silicon nitride ($Si_3N_4$), or a nitrogen containing layer other than $Si_3N_4$, such as $Si_xN_y$, silicon oxynitride $SiO_xN_y$, silicon oxime $SiO_xN_yH_z$, or a combination thereof. As shown in FIGS. 1, 2 and continuing below, the dummy sidewall spacers are formed of two layers to allow for selective etching and patterning. The sidewall spacers 17, 19 are called "dummy" because they will be removed before the PFET transistor is completed and main electrode spacers (not shown) will be formed over the gate 13 and gate dielectric 15. The dummy spacers 17, 19 are used to space the recesses for the source and drain material from the gate electrode structure.

The dummy sidewall spacers 17, 19 may be formed from a layer comprising $Si_3N_4$ that has been formed using chemical vapor deposition (CVD) techniques using silane and ammonia as precursor gases. Other spacer materials may be used. The sidewalls spacers 17, 19 may be patterned by performing an isotropic or anisotropic etch process. In an embodiment, the sidewall spacers 17 and 19 are from about 5 nanometers to about 50 nanometers thick. In one embodiment, the spacer material 19 is an oxide such as $SiO_2$ and the spacer material 19 is a nitride, such as SiN, $Si_3N_4$. However, other arrangements are contemplated as additional embodiments.

Figure 3:
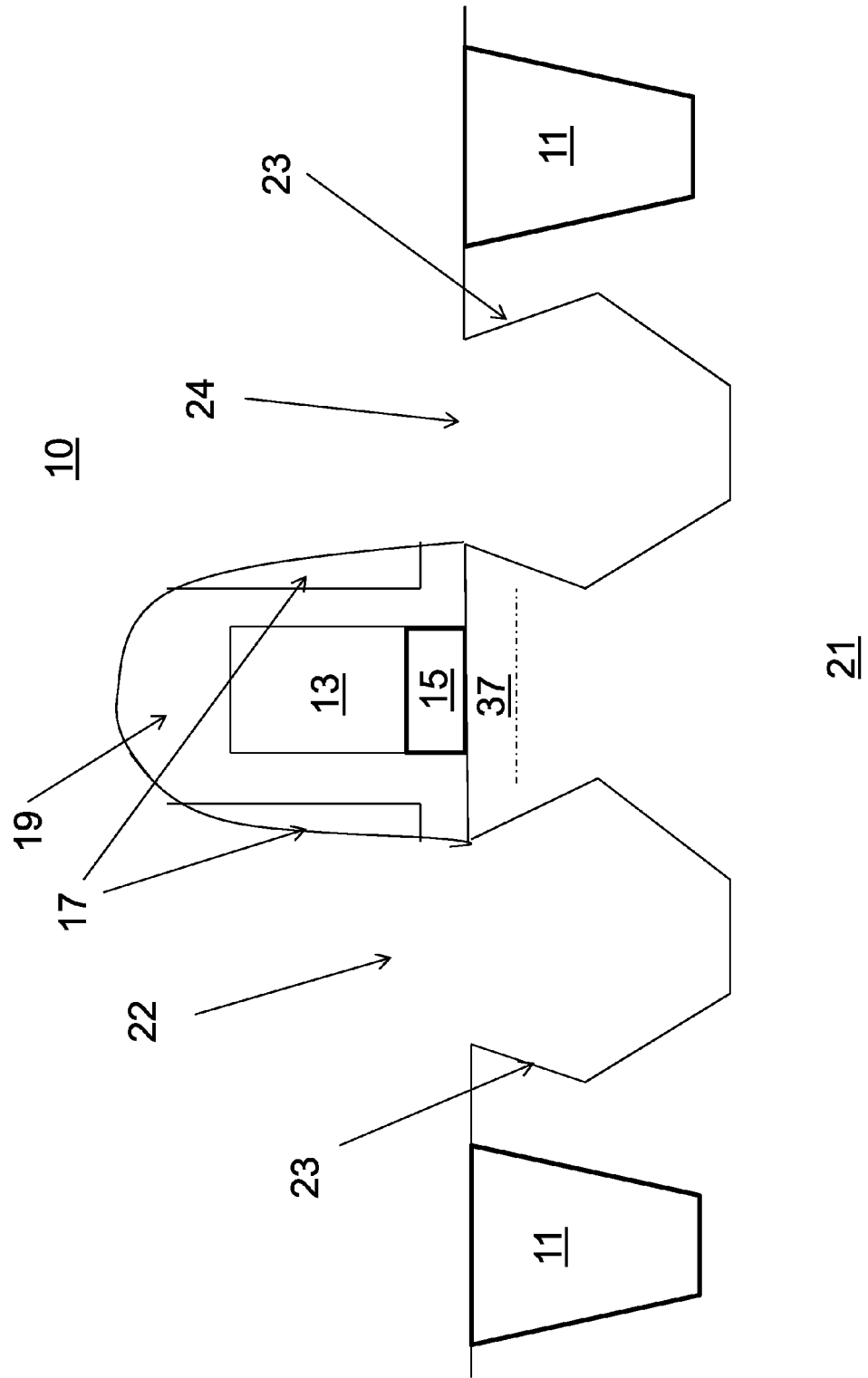

FIG. 3 illustrates the embodiment transistor 10 of FIG. 2 following additional processing. Recessed regions 23 are formed by an etching process that creates recessed regions 23 in the source/drain regions 22, 24 on either side of the gate electrode 13. Recessed regions 23 may be formed by plasma etch using fluorine, chlorine, or bromine chemistry. In the example embodiment illustrated here, the shape obtained for the recesses has "V shaped" sidewalls. This shape may be obtained, for example, by first performing an isotropic or directional dry etch, which forms a "U" shape. This dry etch is then followed by a wet etch which; due to the anisotropic nature of the wet etch process, forms the "V" shape on the sidewalls. Alternatively, the recessed regions 23 may be wet etched or dry etched using various alternative chemistries. The recessed regions 23 may have a depth between about 20 nanometers and 100 nanometers and preferably between about 45 nanometers and 90 nanometers.

In the illustrative embodiments, the recessed regions 23 have "V" shaped sidewalls. This shape is selected to extend the SiGe stressor closer to the channel region in a portion of the source drain regions. This shape creates a more effective compressive stress in the channel region.

Dummy sidewalls are 17, 19 useful in defining the edge of the recessed regions 23 and in protecting the gate structure 13/15 during recessed region 23 etching processes. Because a conventional source/drain implant uses the gate electrode 13 and gate electrode spacers as an implant mask, further source/drain implants may be performed after forming the permanent electrode spacers.

Figure 4:
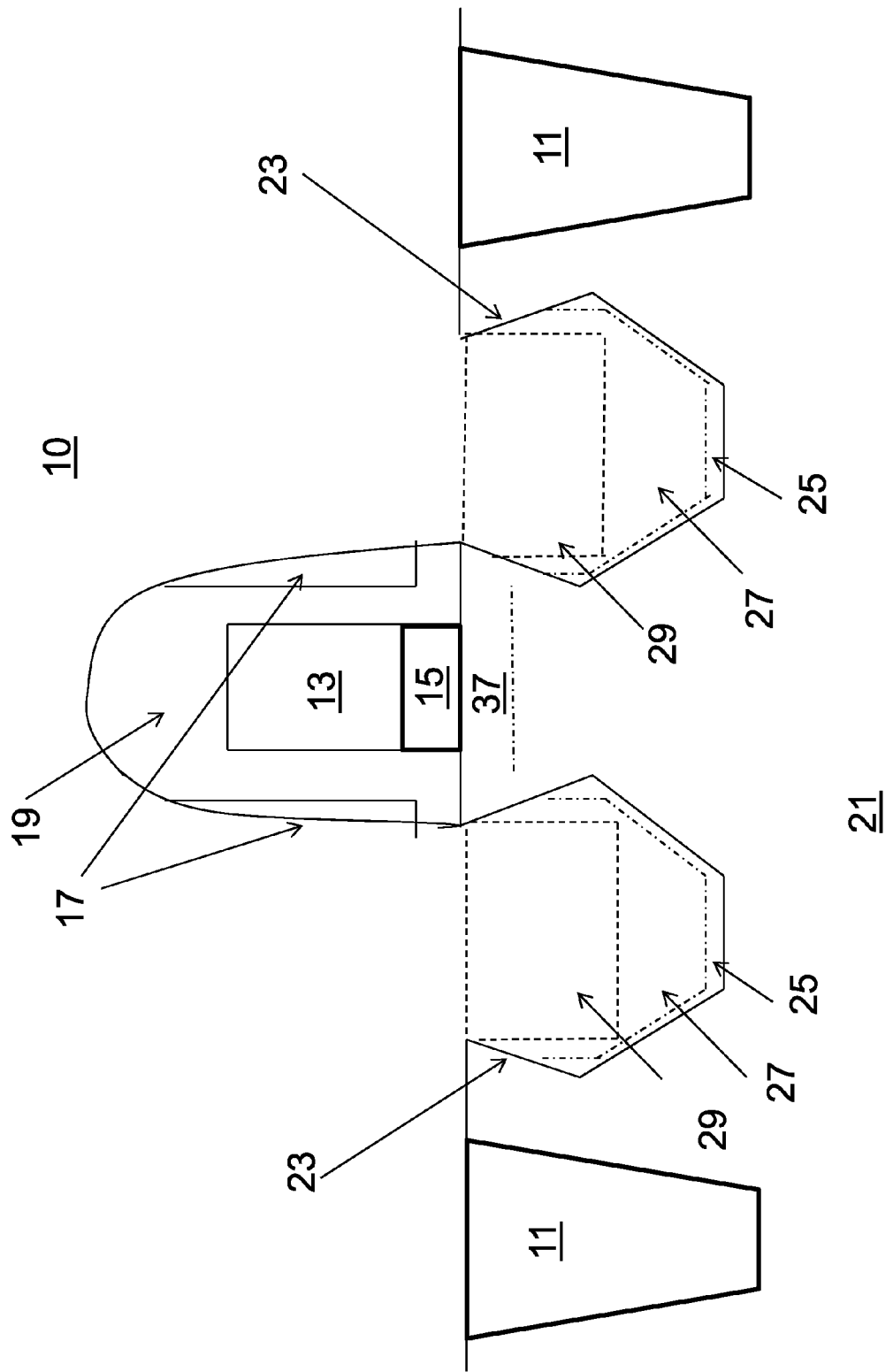

As shown in FIG. 4, the boron doped e-SiGe embedded stressor is disposed into recessed region 23 in several layers 25, 27 and 29. More layers will be described below. Epitaxial growth of the SiGe is preferable; however, other forms of disposing SiGe into the recessed regions may be used. The epitaxial process used to deposit the embedded stressor layers in source/drain regions 22, 24 may include chemical vapor deposition, ultra-high vacuum chemical vapor deposition (UHV-CVD), or molecular beam epitaxy (MBE). In the embodiments, the SiGe embedded stressor layers 25, 27, 29 in the source/drain regions 22, 24 has a capping layer or layers described below.

The selective epitaxy used to form the SiGe layers may include using silane or dichlorosilane and an etching gas, such as HCl. The selective epitaxy process may be carried out at less than about 900° C., and preferably between about 600 and 800° C. While an illustrative embodiment has an example of SiGe:B as a stressor, other materials are within the scope of the embodiments such as for example Si:Sb, for example. Sources for the boron include diborane ($B_2H_6$) gas used during SiGe epitaxy, and $BF_2$, for example. Methods other than epitaxial growth of embedded stressor may be implemented in accordance with an illustrative embodiment. Boron doping of the SiGe may be accomplished by doping the epitaxial SiGe in-situ as the SiGe is grown in embedded stressor layers 15, 27, 29. Boron or other doping may also be accomplished by implant methods.

As used in this description, the term "source region" and "drain region" really means either of the regions 22, 24. Whether the region 22, or 24, acts as the source or drain of the PMOS FET 10 will depend on the electrical potentials placed on these terminals after the transistor 10 is completed. From a process point of view, the regions are usually referred to as "source/drain" regions as they have identical physical characteristics and the same processing requirements. So the terms source and drain regions may apply to either 22, or 24, in the figures.

In the embodiments, the SiGe epitaxial process is controlled to create a plurality of boron doped and undoped epitaxial SiGe levels such as 25, 27 and 29 in FIG. 4 within the epitaxial SiGe source/drain regions 22, 24 formed in recesses 23. The formation of these doped and undoped SiGe layers is performed "in-situ" and without interrupting an epitaxial process. This is done by controlling the dopant gas during epitaxial growth. In an embodiment, a first SiGe level L1, labeled 25 in the figures, has no boron. This is a thin SiGe layer formed at the Si/SiGe interface, at the edges of the recesses 23. Using this thin SiGe layer without boron helps stabilize the threshold voltage Vt in the PFET device. This first layer 25 may be from 1-20 nanometers in thickness, for example. A lightly doped layer L2, numbered 27 in the figures, is then formed containing boron at a concentration in a range from $3\times10^{18}/cm^3$ to $1\times10^{19}/cm^3$ is next formed in-situ. By adding boron during the SiGe epitaxial process a doped layer 27 is formed over undoped SiGe layer L1.

The in-situ epitaxy continues and the next layer, L3, numbered 29 in FIG. 4, is formed. This layer is another undoped (boron free) SiGe stressor layer and is optionally provided. That is, in some alternative embodiments this layer may be omitted, but this layer, which is from 5 to 10 nanometers thick in an example process, may further increase the SCE performance obtained.

The in-situ born doped SiGe epitaxy continues until transistor 10 is formed as shown in FIG. 1, above. A layer L4, numbered 35 in the drawings, is formed. This is a highly doped SiGe layer, which has a concentration of boron atoms ranging from $6\times10^{19}/cm^3$ to $5\times10^{20}/cm^3$. This layer provides the dopant needed to form a P-type MOSFET transistor, and the use of the boron also lowers the sheet resistance of the source and drain regions. Layer 35 may be from 40 to 60 nanometers thick, in an example process. Finally, the in-situ epitaxial process continues to form a cap layer, numbered 45 in the figures, that has the highest boron doping levels in the layers shown, ranging from a concentration of $8\times10^{20}/cm^3$ to $4\times10^{21}/cm^3$. This cap layer is provided to lower the sheet resistance of the SiGe to provide excellent contact characteristics for a contact to be formed to the source and drain regions. This layer may be from 15-25 nanometers thick, for example, in an example process.

The addition of the layers L1, L2, and optional layer L3, which are respectively numbered 25, 27 and 29 in the Figures, increases device performance particularly when using the V shaped sidewalls for the source drain regions and the boron doped SiGe stressor material. In experiments with an undoped bottom layer, the layer 35 and cap layer 45 in FIG. 1, for example, junction leakage was observed to occur at the Si/SiGe interface in recesses 23. In another experiment, a lightly doped SiGe layer was used as the bottom layer, and then layers 35, and 45, were formed. In this arrangement junction leakage improved but a boron "pileup" problem was observed. The wet etch process leaves some rough surfaces in the recessed portions 23. When the lightly doped layer was the bottom layer, boron atoms tended to concentrate and in some areas the concentration could increase by as much as order of magnitude or 10× the designed boron concentration. Concurrently with this problem, a change in the $V_t$ for the transistor of about 100 millivolts degradation occurred due to the adverse impact on SCE.

Figure 5:
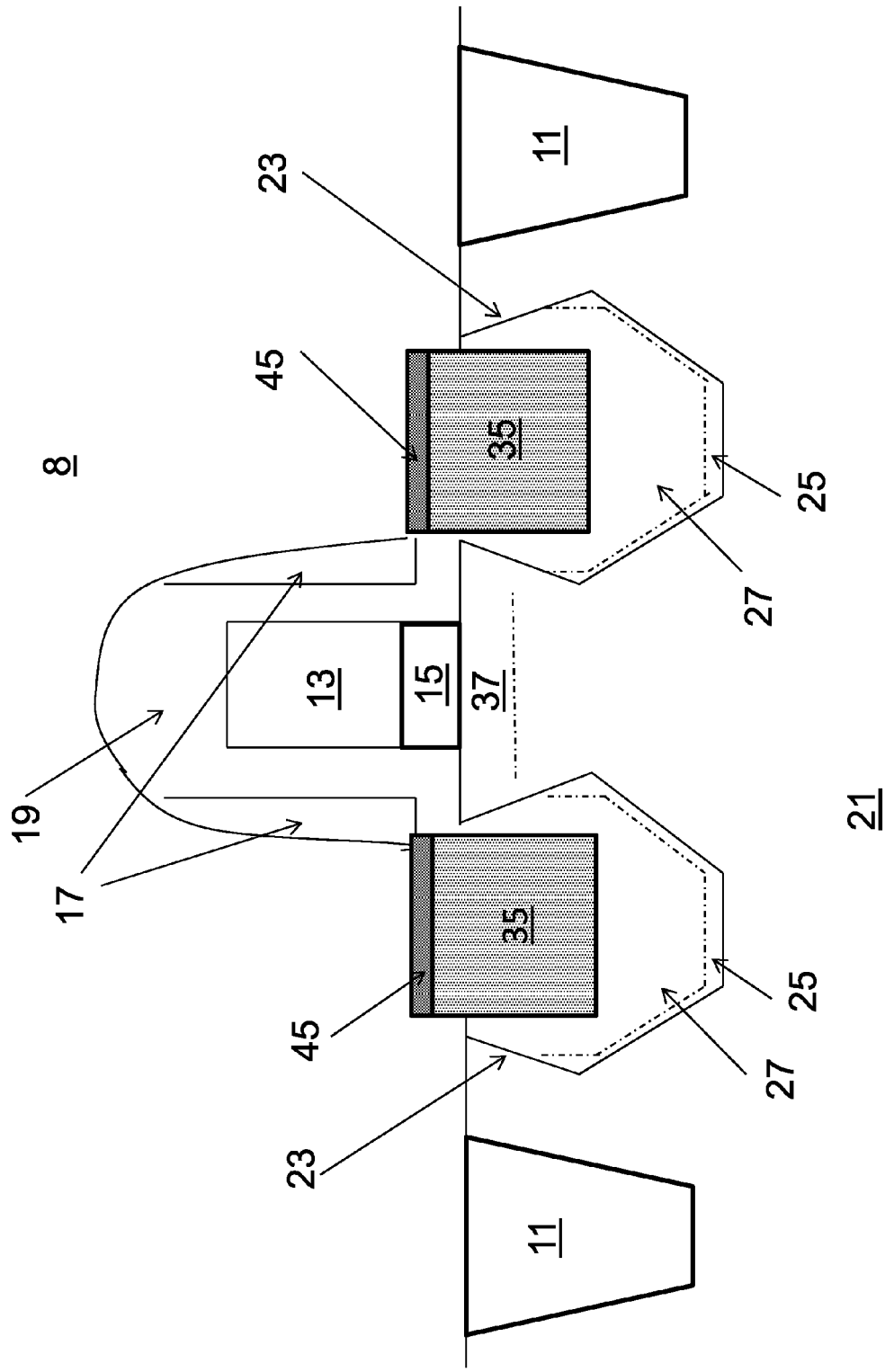
FIG. 5 depicts in a cross-sectional view selected features of another illustrative embodiment.

Use of the embodiments removes these problems. The use of the undoped first layer, 25 in the Figures, and the lightly doped second layer, 27 in the Figures, with the highly doped SiGe layer 35 and the cap layer 45, provides a solution to both the junction leakage and the adverse SCE effects. Adding the undoped third layer, 29 in the Figures, further improves performance although in some embodiments this layer is omitted. FIG. 5 depicts a transistor 8 in a cross sectional view which has the same source drain recesses 23 and the same SiGe stressor layers, as transistor 10 in FIG. 1 above, except that in this alternative embodiment, the third layer, the undoped SiGe layer numbered 29 in FIG. 1, is omitted. Each embodiment provides increased performance over known approaches and devices.

Figure 6:
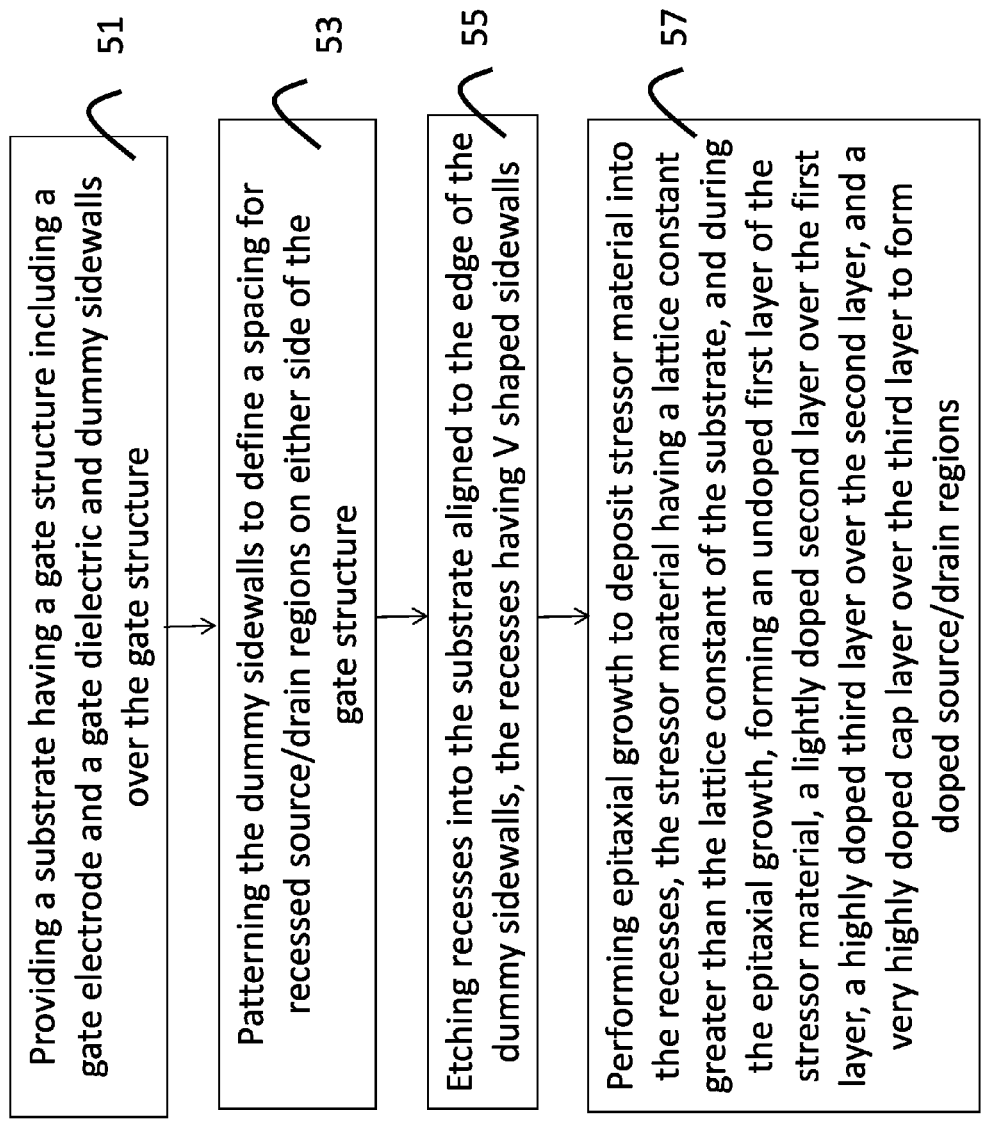
FIG. 6 shows a process flow according to a first illustrative embodiment.

FIG. 6 illustrates in a flow diagram a method of process steps according to a first illustrative embodiment. The process begins by providing a substrate including a gate structure (step 51). The gate structure may comprise a conductive gate electrode and a gate dielectric. The gate structure further comprises dummy sidewalls. Dummy sidewalls are formed on the sides of the gate structure as spacers. The dummy sidewalls aid in defining the edge of the recessed regions.

Patterning of the dummy sidewalls is performed in step 53. The patterning provides spacing for the recesses formed below from the gate structure. The dummy sidewalls are later removed and replaced with main electrode sidewalls, which are used to space the contacts to the source/drain regions from the gate electrode structure.

Recessed regions are etched into a portion of the substrate to form source/drain region on either side of the gate electrode (step 55). The etch process is selected to shape the recesses to have V shaped sidewalls with the V extending towards a channel region beneath the gate electrode. The etch process may be performed by performing a dry etch first, to form a U shaped recess, followed by a wet etch, to form the V shape in the recess sidewalls.

The stressor material epitaxially grown or otherwise formed in the recess regions is then embedded in the recessed regions of the source/drain (step 57). The stressor is preferably an epitaxial in-situ boron doped SiGe structure. The stressor material is formed in multiple layers. A first layer is formed as thin layer at the bottom of the recesses, and is undoped stressor material. A second layer of lightly doped material is then formed over the first layer. A highly doped layer is then formed over the lightly doped layer, the highly doped layer forming the source or drain region for a transistor. A very highly doped cap layer of the stressor material is then formed over the highly doped layer. An optional undoped layer may be formed between the lightly doped second layer and the highly doped third layer.

Figure 7:
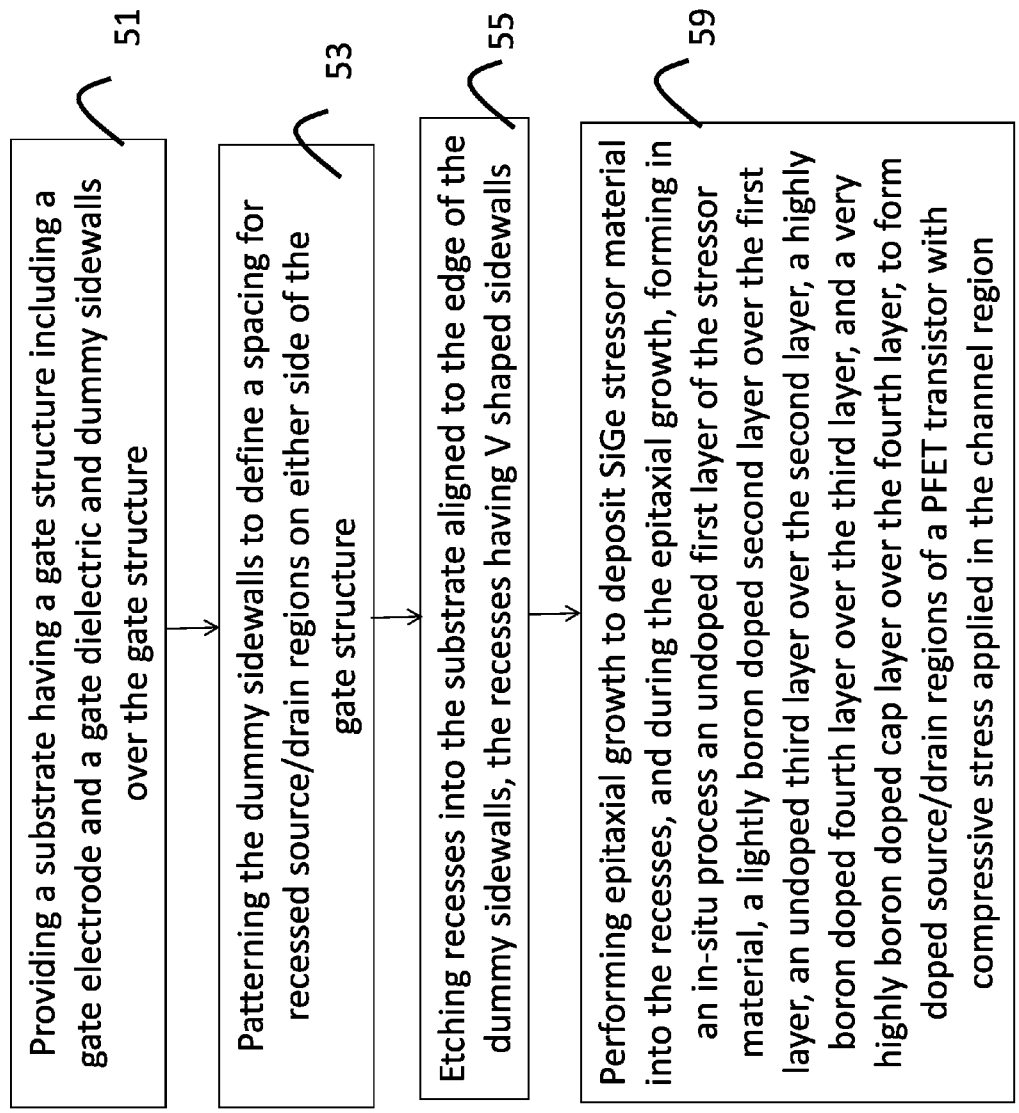
FIG. 7 shows a process flow according to a second illustrative embodiment.

FIG. 7 depicts in a flow diagram the steps of an alternative method embodiment. Steps 51, 53 and 55 are the same as for FIG. 6, in step 5 a substrate is provided having a gate structure including a gate electrode and a gate dielectric, and having dummy sidewalls over the gate structure. In step 53 the dummy sidewalls are patterned to define a spacing for the source/drain recesses. In step 55, etch of the recesses is performed to form recesses with V shaped sidewalls.

Step 59 is an epitaxial growth step to deposit SiGe in the recesses. In step 59, boron doped SiGe is formed in several layers of different boron doping in an in-situ epitaxy process. A first layer of undoped material is formed at the bottom and sides of the recesses. A second layer of lightly doped SiGe is formed over the first layer. In this embodiment, a third layer of undoped SiGe is formed over the second layer. A highly boron doped SiGe layer is formed as a fourth layer over the third layer, and a very highly boron doped SiGe cap layer is formed over the fourth layer to form the source and drain regions for a PMOS FET transistor with compressive stress applied to the channel region.

A feature of the embodiments is to prevent the boron "pileup" observed in experiments with prior known structures, and to avoid the junction leakage problems observed in known structures. Use of the embodiments is economical and no additional mask steps are needed, and little modification is needed to existing processes.

In an embodiment, a semiconductor device includes a gate structure on a semiconductor substrate; and a source region and a drain region recess formed in the semiconductor substrate on opposing sides of the gate structure; wherein each of the source region and the drain region recesses is filled with a plurality of doped stressor layers, including a first layer of undoped stressor material layer, a second layer of lightly doped stressor material including dopant atoms over the first layer, a highly doped layer of stressor material having a concentration of dopant atoms greater than the lightly doped second layer, and a cap layer over the highly doped layer having a concentration of dopant atoms greater than the highly doped layer.

In yet another embodiment, the semiconductor device further includes a third undoped layer of stressor material free from dopant atoms disposed between the second layer and the highly doped layer. In yet another embodiment of the semiconductor device, the dopant atoms comprise boron. In still a further embodiment, the doped stressor is SiGe doped with boron. In still another embodiment, in the semiconductor device the doped stressor comprises e-SiGe.

In a further embodiment, in the semiconductor device the source region and drain region recess each have V shaped sidewalls. In yet another embodiment, in the semiconductor device the first layer has a thickness of between 1 and 20 nanometers. In another embodiment the semiconductor device includes a dopant concentration of the second lightly doped stressor layer between $3 \times 10^{18}/cm^3$ and $1 \times 10^{19}/cm^3$. In a further embodiment, the dopant concentration of the highly doped stressor layer is between $6 \times 10^{19}/cm^3$ and $5 \times 10^{20}/cm^3$.

In a method embodiment, the method of manufacturing a semiconductor device includes providing a substrate including a gate structure having dummy sidewalls overlying the gate structure; etching V shaped recesses on opposing sides of the gate structure; and forming a doped stressor into the recesses, wherein forming the doped stressor includes forming a first layer of stressor material that is undoped, forming a second lightly doped layer of stressor material over the first layer, forming a highly doped layer of stressor material over the second layer having a dopant concentration greater than the second lightly doped layer, and forming a cap layer of doped stressor material overlying the highly doped layer of stressor material having a dopant concentration greater than the highly doped layer.

In a further embodiment, the above method further includes a third undoped layer of stressor material formed between the second lightly doped layer of stressor material and the highly doped layer of stressor material. In still a further embodiment, the above method continues and the doped stressor comprises SiGe doped with boron. In yet another embodiment, the method includes forming epitaxial SiGe with a boron dopant gas in an in-situ process.

In another embodiment, a PMOS transistor includes a gate structure on a silicon substrate; and a source region recess and a drain region recess formed in the silicon substrate on opposing sides of the gate structure; wherein each of the source region and the drain region recesses is filled with a plurality of boron doped SiGe stressor layers, including a first layer of undoped SiGe stressor material, a second layer of lightly boron doped SiGe stressor material over the first layer, a third layer of undoped SiGe stressor material over the second layer, a highly boron doped layer of SiGe stressor material having a concentration of dopant atoms greater than the lightly doped second layer, and a cap layer of boron doped SiGe stressor material over the highly doped layer having a concentration of dopant atoms greater than the highly doped layer. In still another embodiment the PMOS transistor includes a channel region underlying the gate structure that receives compressive stress due to the SiGe stressor layers in the source region and drain region recesses.

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   etching a recess into a substrate; and
   epitaxially growing a source/drain region in the recess, the source/drain region comprising a first undoped layer of stressor material lining the recess, a lightly doped layer of stressor material over the first undoped layer, a second undoped layer of stressor material over the lightly doped layer, and a highly doped layer of stressor material over the second undoped layer.

2. The method of claim 1, wherein etching the recess comprises a plasma etch process using fluorine, chlorine, or bromine chemistry.

3. The method of claim 1, wherein the recess has V-shaped sidewalls, and wherein the etching comprises isotropically etching the substrate to form an intermediate recess having U-shaped sidewalls, and anisotropically etching the intermediate recess to form the recess has V-shaped sidewalls.

4. The method of claim 3, wherein isotropically etching the substrate comprises a dry etch process, and wherein anisotropically etching the intermediate recess comprises a wet etch process.

5. The method of claim 1, wherein the recess extends into the substrate by a distance in a range from about 20 nanometers to about 100 nanometers.

6. The method of claim 1, wherein epitaxially growing the source/drain region in the recess comprises at least one of a chemical vapor deposition process, an ultra-high vacuum chemical vapor deposition process, or a molecular beam epitaxy process.

7. The method of claim 1, further comprising forming a cap layer overlying the highly doped layer of stressor material, the cap layer having a dopant concentration greater than the highly doped layer of stressor material.

8. The method of claim 1, wherein epitaxially growing the source/drain region in the recess comprises forming epitaxial SiGe with a boron dopant gas in an in-situ process.

9. A method of manufacturing a semiconductor device, the method comprising:
   etching recesses on opposing sides of a gate structure;
   forming a first undoped layer of SiGe in each of the recesses;
   forming a lightly doped layer of SiGe in the recesses and over the first undoped layer;
   forming a second undoped layer of SiGe in the recesses and over the lightly doped layer;
   forming a highly doped layer of SiGe over the second undoped layer; and
   forming a cap layer over the highly doped layer of SiGe.

10. The method of claim 9, wherein the highly doped layer of SiGe comprises a first portion disposed in the recesses, and a second portion protruding out of the recesses.

11. The method of claim 9, wherein the cap layer has a dopant concentration greater than the highly doped layer of SiGe.

12. The method of claim 9, wherein the cap layer has a dopant concentration between $8\times10^{20}/cm^3$ and $4\times10^{21}/cm^3$.

13. The method of claim 9, wherein forming the lightly doped layer of SiGe comprises epitaxially forming a first boron-doped SiGe layer over the first undoped layer of SiGe, a concentration of boron in the first boron-doped SiGe layer being between $3\times10^{18}/cm^3$ and $1\times10^{19}/cm^3$.

14. The method of claim 9, wherein forming the highly doped layer of SiGe comprises epitaxially forming a second boron-doped SiGe layer over the second undoped layer, a concentration of boron in the second boron-doped SiGe layer being between $6\times10^{19}/cm^3$ and $5\times10^{20}/cm^3$.

15. The method of claim 9, wherein the recesses comprise V-shaped recesses, and wherein etching the V-shaped recesses comprises performing a directional dry etch into portions of a substrate followed by a wet etch of the directional dry etched portions of the substrate.

16. A method of manufacturing a semiconductor device, the method comprising:
   epitaxially growing a plurality of stressor layers in a V-shaped recess laterally adjacent to a channel region of a transistor, the plurality of stressor layers comprising a first undoped layer of stressor material, a lightly doped layer of stressor material over the first undoped layer, a highly doped layer of stressor material over the lightly doped layer, and a second undoped layer of stressor material disposed between the lightly doped layer and the highly doped layer.

17. The method of claim 16, wherein epitaxially growing the plurality of stressor layers in the V-shaped recess comprises a selective epitaxy process carried out at a temperature between about 600 degrees Celsius and about 800 degrees Celsius.

18. The method of claim 16, wherein epitaxially growing the plurality of stressor layers in the V-shaped recess comprises at least one of a chemical vapor deposition process, an ultra-high vacuum chemical vapor deposition process, or a molecular beam epitaxy process.

19. The method of claim 16, wherein the lightly doped layer of stressor material and the highly doped layer of stressor material comprise boron-doped SiGe.

20. The method of claim 19, wherein epitaxially growing the plurality of stressor layers in the V-shaped recess comprises using silane or dichlorosilane as a silicon-source gas, and using diborane or difluoroboron as a boron-source gas.

* * * * *